(12) United States Patent
Choi et al.

(10) Patent No.: US 10,685,687 B2
(45) Date of Patent: Jun. 16, 2020

(54) SECURE MEMORY ELEMENT FOR LOGICAL STATE STORAGE

(71) Applicants: Dialog Semiconductor (UK) Limited, London (GB); Dialog Semiconductor Inc., Campbell, CA (US)

(72) Inventors: Jung Woo Choi, Pleasanton, CA (US); John Kesterson, Seaside, CA (US); Gary Hague, Swindon (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/799,171

(22) Filed: Oct. 31, 2017

(65) Prior Publication Data

US 2019/0130948 A1     May 2, 2019

(51) Int. Cl.
  *G11C 7/10*      (2006.01)
  *G11C 11/412*    (2006.01)
  *G11C 11/419*    (2006.01)

(52) U.S. Cl.
  CPC ............ *G11C 7/109* (2013.01); *G11C 7/1087* (2013.01); *G11C 11/412* (2013.01); *G11C 11/419* (2013.01)

(58) Field of Classification Search
  CPC ......... G11C 7/109; G11C 7/1087; G11C 7/22; G11C 7/1057; G11C 7/106; G11C 7/1084
  USPC ...... 365/54, 57, 202, 142, 199, 217; 327/54, 327/57, 202, 142, 199, 217; 326/94
  See application file for complete search history.

(56) References Cited

U.S. PATENT DOCUMENTS 3,824,409 A * 7/1974 Patil .................... H03K 19/086
                                                 327/19
5,875,339 A * 2/1999 Molnar ................. G06F 13/364
                                                 710/240

OTHER PUBLICATIONS

"Introduction to VSLI Systems," Chapter 7: System Timing, by Charles L. Seitz, Copyright 1978, Carver A. Mead & Lynn A. Conway, 37 pgs.
"Design and Analysis of Testable Mutual Exclusion Elements," by Yang Zhang et al., 21st IEEE Symposium on International Asynchronous Circuits and Systems (Async), May 4-6, 2015, 8 pgs.
White paper entitled, "Understanding Metastability in FPGAs," published by Altera Corporation, Jul. 2009, pp. 1-6.

* cited by examiner

*Primary Examiner* — Alfredo Bermudez Lozada
(74) *Attorney, Agent, or Firm* — Saile Ackerman LLC; Stephen B. Ackerman

(57) ABSTRACT

A memory element is provided in which a logical state can be securely stored in all conditions even when input set and reset signals are overlapping. This is achieved through provision of an array of persistence latches with an asynchronous circuit that ensures correct operation. The persistence latches provide a persistent output for each of the first and second edges of each input. The memory element is arranged to receive a plurality of inputs including a first and second input. Each first and second inputs include a digital signal that can transition between a first state via a first edge which triggers transition from the first state to the second state and a second edge which triggers transition from the second state to the first state.

9 Claims, 16 Drawing Sheets

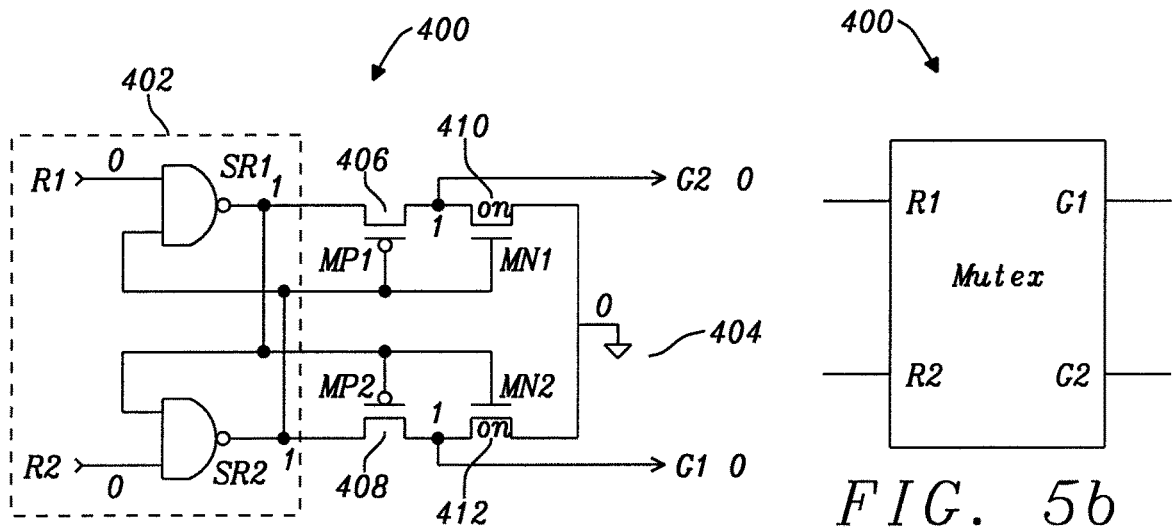
FIG. 5a Prior Art
FIG. 5b Prior Art
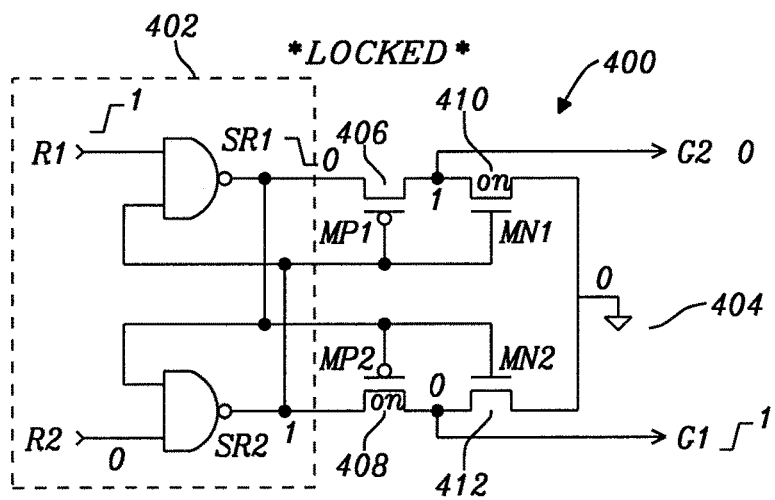
FIG. 5c Prior Art
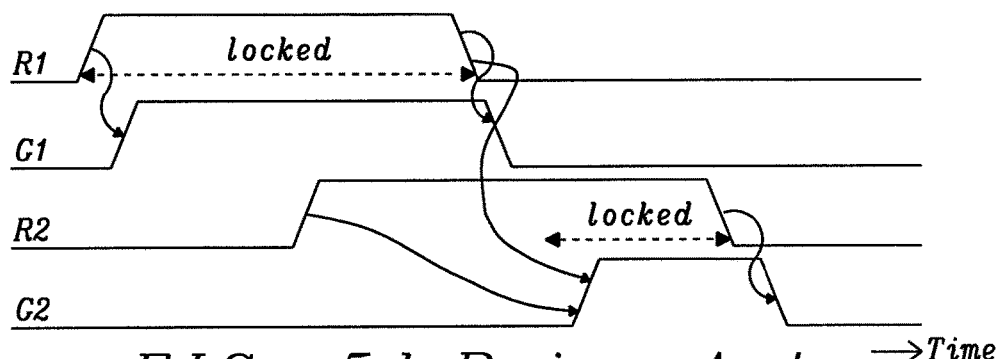
FIG. 5d Prior Art

SECURE MEMORY ELEMENT FOR LOGICAL STATE STORAGE

TECHNICAL FIELD

The present disclosure relates to a memory element of the type used for storage of information in digital logic and computer memory.

BACKGROUND

Storage of information is crucial to the correct operation of most modern circuits such as digital logic and computer memory. A memory element for storing information receives one or more input signals which can change the value of the stored information, and at least one output for presenting the stored information. The stored information may be a logic value and changing the logic value may comprise changing the stored value between two or more logic states. Two common forms of such memory elements are flip-flops and latches which are examples of bistable multi-vibrators where a logic value held by a circuit can be flipped from one state to another by an external trigger pulse. In common usage, the term flip-flop refers to a synchronous circuit which is edge-sensitive and relies on a clock to ensure its correct operation, and a latch is a circuit which is transparent and is level-sensitive.

FIG. 1 illustrates a prior art latch circuit 100 in which a pair of cross-coupled NOR gates 102, 104 receive respective reset (R) and set (S) signals. The stored bit of information is presented at the output Q with its complement $\overline{Q}$ also being available as an output if required. The latch of FIG. 1 is transparent, in that an input signal change causes immediate change in its output.

FIG. 2 illustrates a gated version of the latch 100 of FIG. 1. This clocked RS flip-flop 200 includes additional circuitry comprised of a pair of AND gates 202, 204 coupled with an enable signal (E) which may for example be a clock signal, or a read or write strobe signal. The operation of the circuits of FIGS. 1 and 2 is well known to the person skilled in the art and will not be described in detail herein.

A problem that occurs with memory elements is dealing with incoming input signals that overlap. This is illustrated with respect to FIGS. 3a, 3b and 3c which shows the changing of input signals between high and low values (y-axis) over time (x-axis). FIG. 3a shows a normal condition which is expected for ensuring correct operation of an RS flip-flop. Here it can be seen that a set signal pulse (S) rises and falls in a short period of time and there is a large gap before the rise and fall of the reset signal pulse (R). The output Q of the flip-flop is set to a first logic state, "1", by the rising edge of the set pulse (S) and then reset to a second logic state, "0", by the rising edge of the reset pulse (R). This operation is stable.

However, in application areas where it is required to change the stored logic value at a high frequency, then it is often the case that the set and reset pulses may overlap and examples of such abnormal conditions are shown in FIG. 3b and FIG. 3c. Both of the abnormal conditions shown in FIGS. 3b and 3c have portions of time (300 and 302 respectively), where both of the set and reset signals are high at the same time. In the case of FIG. 3b the rising edge of the reset pulse occurs during the time when the set pulse is high and in FIG. 3c the rising edge of the set pulse occurs during the time while the reset signal is high.

For the types of latches and flip-flops illustrated in FIGS. 1 and 2, this "1-1" state is forbidden because it breaks the logical equation that the output Q is not its complement. This problem can be solved by adding gates to the inputs that converts the 1-1 state to one of the non-restricted combinations, resulting in either an S-dominated latch or an R-dominated latch or by toggling the output as seen in a JK latch.

However, even with these solutions, there are still fundamental problems in high frequency applications in dealing with the overlap of set or reset functions. Therefore, an improved memory element that provides better characteristics is desired.

SUMMARY

According to a first aspect of the disclosure, there is provided a memory element that is arranged to: receive a plurality of inputs comprising a first input and a second input, wherein each of said first and second inputs comprises a digital signal that can transition between a first state via a first edge which triggers transition from the first state to the second state and a second edge which triggers transition from the second state to the first state; retain a logical state based on said plurality of inputs; and provide an output representing said retained logical state; said memory element comprising circuitry arranged such that said logical state is retained at a first logical value throughout the course of a time period between the first edge of the first input and the first edge of the second input, irrespective of the state of both the first and second inputs when each of their respective first edges are detected.

Optionally, said circuitry comprises a plurality of persistence latches and an asynchronous circuit; wherein: the plurality of persistence latches provides a persistent output for each of the first and second edges of each input; each persistence latch is arranged to receive an input trigger command from the asynchronous logic circuit which controls the opening and closing of a time window throughout the course of which an input signal is looked for by the persistence latch; and said asynchronous logic circuit provides a sequence of states whereby said logical state is retained at a first logical value throughout the course of a time period between the first edge of the first input and the first edge of the second input, irrespective of the state of both the first and second inputs when each of their respective first edges are detected.

Optionally, the plurality of persistence latches comprises a pair of persistence latches associated with each of the first and second input signals, a first member of said pair providing a persistence output which goes to a first logical value when a first edge of the associated input signal is received and a second member of said pair providing a persistence output which goes to a second logical value when a second edge of the associated input signal is received.

Optionally, one of said first and second inputs comprises a set signal and the other of said first and second inputs comprises a reset input.

Optionally, one of said first and second edges comprises a rising edge and the other of said first and second edges comprises a falling edge.

According to a second aspect of the disclosure, there is provided a high side driver for a power supply circuit comprising a memory element that retains a logical state and provides an output representing said logical state and which is used as a control signal for a high side switch element; wherein said memory element is arranged to: receive a plurality of inputs comprising a first input and a second input, wherein each of said first and second inputs comprises a digital signal that can transition between a first state via a first edge which triggers transition from the first state to the second state and a second edge which triggers transition from the second state to the first state; retain a logical state based on said plurality of inputs; and provide an output representing said retained logical state; said memory element comprising circuitry arranged such that said logical state is retained at a first logical value throughout the course of a time period between the first edge of the first input and the first edge of the second input, irrespective of the state of both the first and second inputs when each of their respective first edges are detected.

Optionally, said circuitry comprises a plurality of persistence latches and an asynchronous circuit; wherein: the plurality of persistence latches provides a persistent output for each of the first and second edges of each input; each persistence latch is arranged to receive an input trigger command from the asynchronous logic circuit which controls the opening and closing of a time window throughout the course of which an input signal is looked for by the persistence latch; and said asynchronous logic circuit provides a sequence of states whereby said logical state is retained at a first logical value throughout the course of a time period between the first edge of the first input and the first edge of the second input, irrespective of the state of both the first and second inputs when each of their respective first edges are detected.

Optionally, the plurality of persistence latches comprises a pair of persistence latches associated with each of the first and second input signals, a first member of said pair providing a persistence output which goes to a first logical value when a first edge of the associated input signal is received and a second member of said pair providing a persistence output which goes to a second logical value when a second edge of the associated input signal is received.

Optionally, one of said first and second inputs comprises a set signal and the other of said first and second inputs comprises a reset input.

Optionally, one of said first and second edges comprises a rising edge and the other of said first and second edges comprises a falling edge.

Optionally, the high side switch comprises a Gan FET.

BRIEF DESCRIPTION OF THE DRAWINGS

Figures 3A, 3B, 3C:
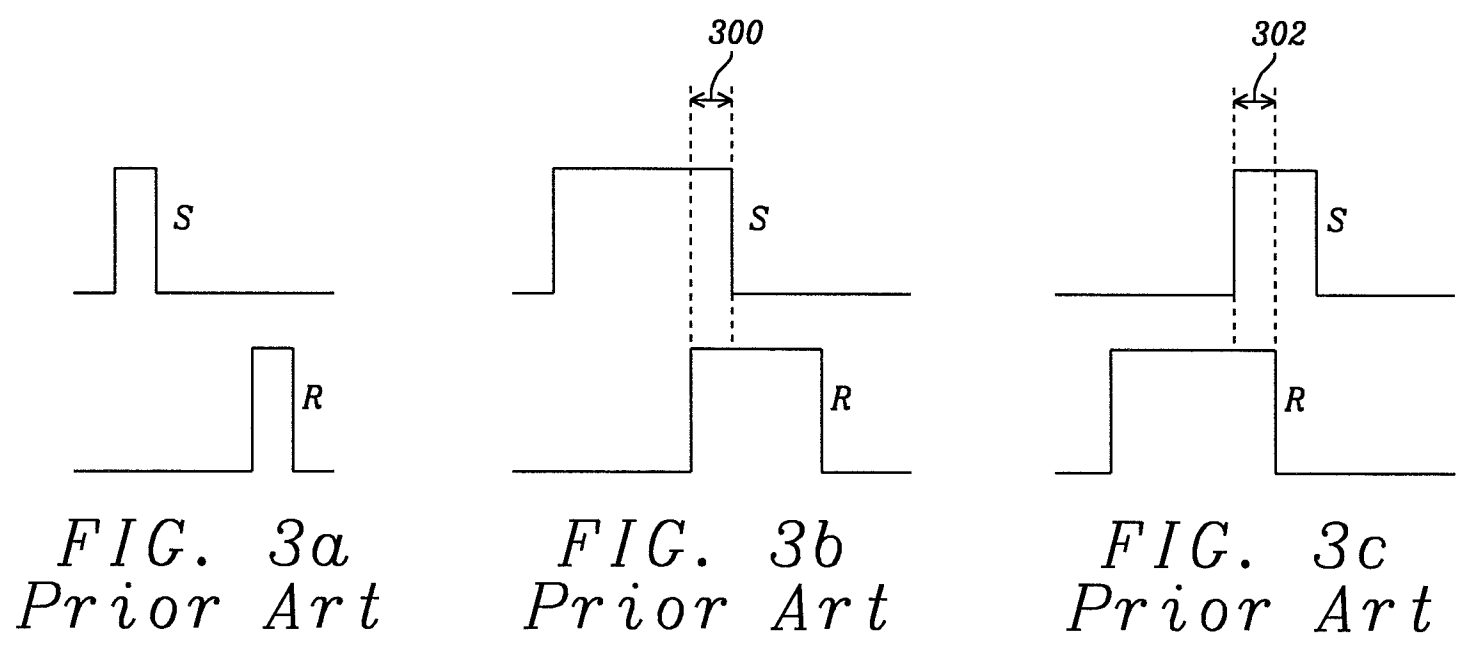

FIGS. 3a, 3b, 3c illustrates timing of set and reset pulses for various operational conditions of the flip-flop of FIG. 2;

FIGS. 5a, 5b, 5c, 5d illustrates operation of the mutual exclusion element of FIGS. 4a and 4b;

DESCRIPTION

A known element for dealing with metastability issues is a mutual exclusion element, known as a "mutex" for short. This is a special asynchronous circuit designed to safely decide the order in which two input signals change.

Figure 1:
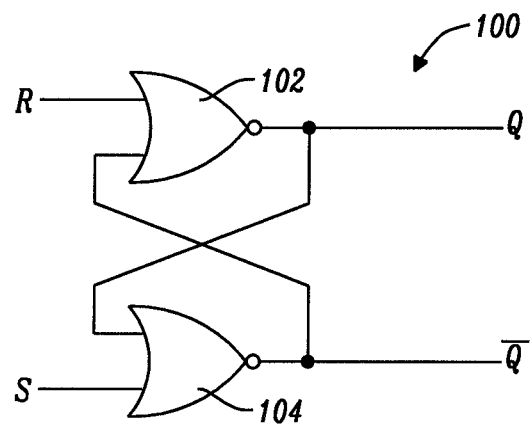
FIG. 1 shows a prior art RS latch.
Figure 2:
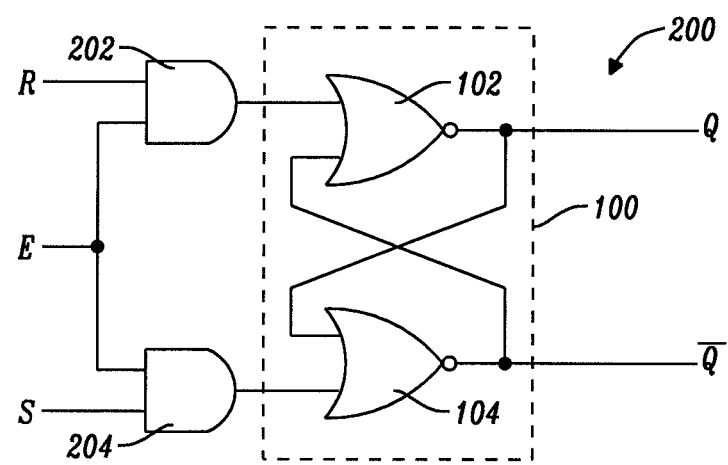
FIG. 2 shows a prior art RS flip-flop being a clocked, gated version of the latch of FIG. 1.
Figure 4A:
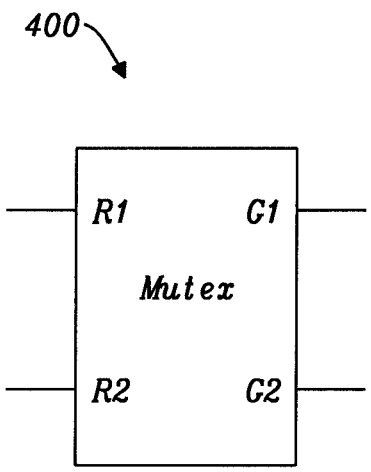
FIGS. 4a, 4b illustrates general characteristics of a known mutual exclusion element.
Figure 4B:
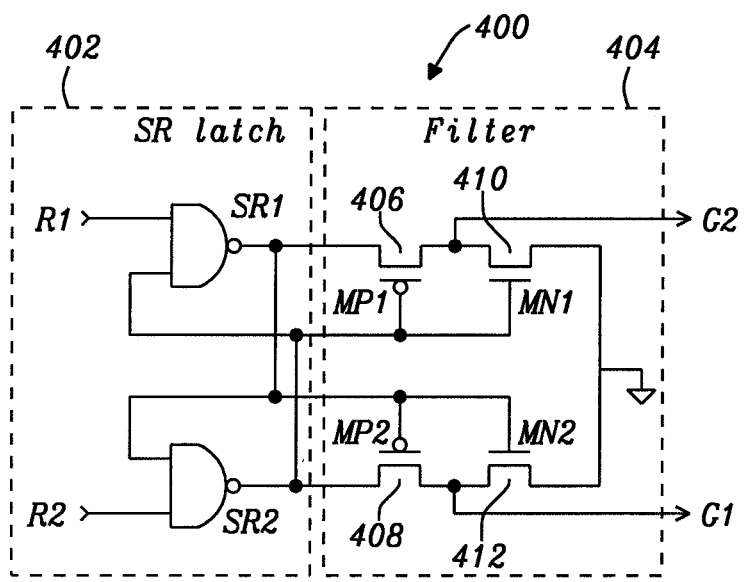

A mutex has two request inputs R1 and R2 and two grant outputs G1 and G2, as illustrated in FIGS. 4a and 4b. If two requests occur at the same time or within a defined metastability time window of each other, there can be a metastable event. The mutex 400 is designed to contain this metastable event within its own logic, keeping both outputs G1, G2 low until such time as the metastability is resolved. Then, the appropriate grant is issued as an output.

In more detail, the mutex 400 comprises an RS latch 402 coupled with the inputs R1, R2 and a filter network 404 which provides the output grant decisions G1, G2. The latch 402 and filter network 404 operate together such that if R1 rises before R2 rises, then G1 rises and G2 is held low. If R2 rises before R1 rises, then G2 rises and G1 is held low. If R1 and R2 rise at the same time, then the circuit will randomly select either G1 or G2.

There are many different ways of implementing the metastability filter 404, but in the example shown the filter network comprises a pair of PMOS transistors MP1, MP2 and a pair of N-MOS transistors MN1, MN2. These are labelled 406, 408, 410 and 412 respectively.

The operation of the mutex of FIGS. 4a and 4b is shown in FIGS. 5a, 5b, 5c and 5d. We consider an initial state where R1=R2=0. Here, the NMOS transistors MN1, 410 and MN2, 412 are both on. If R1 rises it then locks the mutex. In the initial state, R1, R2, G1 and G2 are all at 0 and SR1 and SR2 are outputting a 1. After R1 transitions from 0 to 1, SR1 transitions from 1 to 0. This switches the second PMOS transistor 408 on. In this way, once R1 rises, G1 rises and the mutex is locked such that if R2 subsequently rises it is ignored until R1 falls.

Figure 6A:
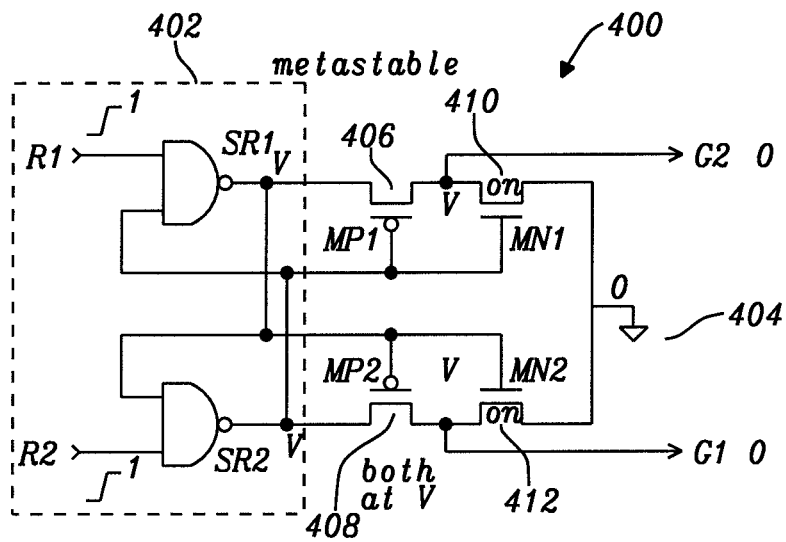
FIGS. 6a, 6b, 6c illustrates the trapping of a metastable event within the mutual exclusion element of FIGS. 4a, 4b, 5a, 5b, 5c and 5d.
Figure 6B:
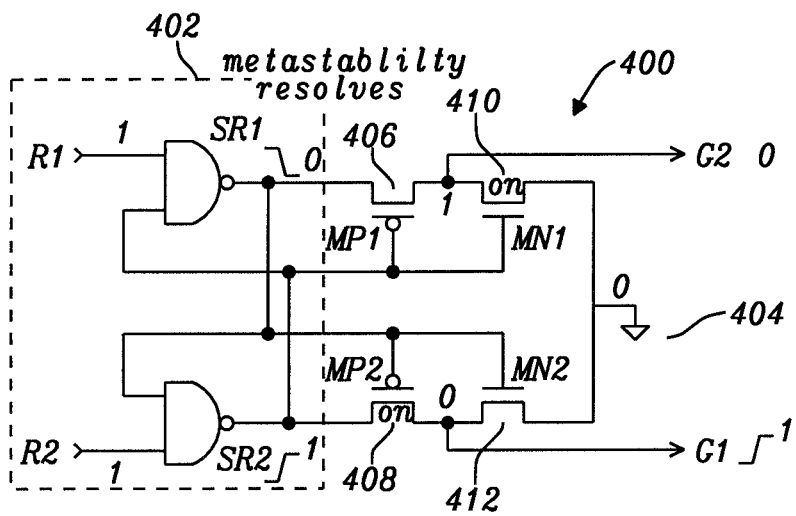
Figure 6C:
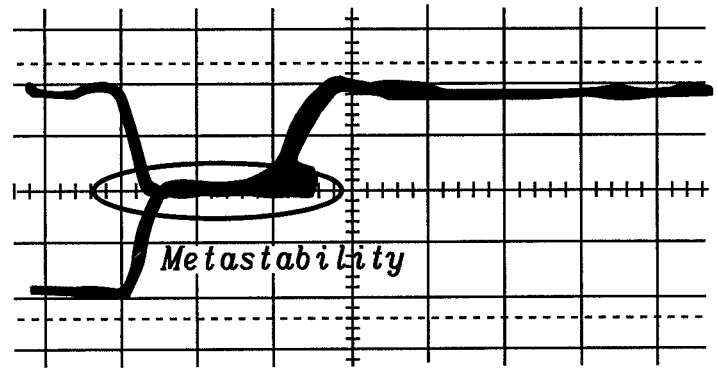

The mutex cell 400 can capture a metastable event as shown with reference to FIGS. 6a, 6b and 6c. Here, it is assumed that R1 and R2 both rise at the same time. This corresponds to a metastability event for the RS latch 402. When the RS latch enters a metastable state, the output goes to VDD/2, SR1=SR2=V=VDD/2 and G1=G2=0. This metastability is trapped inside the mutex until it is resolved, after which time G1 provides its output.

Figure 7A:
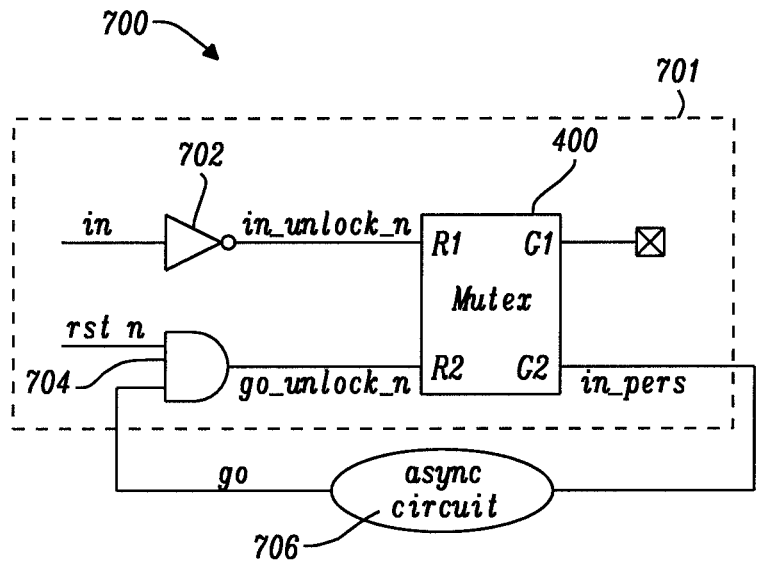
FIGS. 7a, 7b illustrates a prior art persistence latch.
Figure 7B:
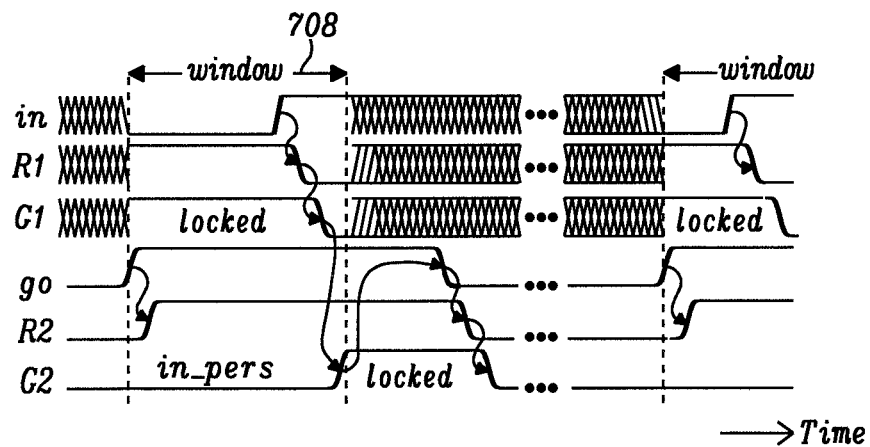

Another known memory circuit 700 is shown in FIGS. 7a and 7b, in which FIG. 7a represents a circuit and FIG. 7b illustrates aspects of its operation. This circuit 700 comprises a persistence latch 701 which operates in conjunction with an asynchronous circuit 706. This memory circuit 700 creates a window in time for checking for an input. The persistence latch 701 here comprises a mutex 400 combined with an inverter 702 and an AND gate 704. One of the mutex 400 grant outputs G2, in_pers, is a persistent output, meaning it is the value that is "locked" by the mutex 400. The other of the grant outputs, G1, is not used. Its output is high while waiting for the input signal to go high which inverted causes R1 to go low. After that happens, G1 goes low and G2 which is the persistent version of the input signal will go high and stay high until request 2 (the go signal) goes away.

The persistent output of the persistence latch 701, in_pers, is sent to an asynchronous circuit 706 which then sends a trigger signal (labelled "go" and referred to alternatively as a GO signal) to the AND gate 704 for unlocking the mutex 400. The output G2 "in_pers" is in a loop and so remains asserted until the asynchronous circuit 706 has used it.

The memory circuit 700 acts to create a controlled stable version of a glitchy signal. The operation of the circuit of FIG. 7a is shown in FIG. 7b. A signal received at the input IN is "looked for" throughout the course of a time window 708. Outside of this time window, the state of the input signal IN is ignored. The asynchronous circuit 706 outputs a GO signal which is set to a first logic value, eg "1" or "true", when it is desired to check for a positive edge or level of an IN signal. The rising edge of "IN" unlocks the mutex 400 since the R1 input of the mutex 400 goes low. Then the "in_pers" signal goes to 1 and remains there until the asynchronous circuit 706 causes the go signal GO to switch state (here, going to "0" or "false" from "1" or "true"). Once the go signal is set, it is independent of the input signal "IN". Therefore, the circuit 700 creates a window in time for checking either an edge or a level of a glitchy input. A change of the IN signal will be acted upon if it occurs during the window 708; and similarly if the IN signal has already gone true before the GO signal window becomes true, then the change in the IN signal will be acted upon once the GO signal goes true. Therefore the memory circuit 700 can operate for incoming "levels" (latches) as well as incoming "edges" (flip flops).

The GO signal from the asynchronous circuit 706 determines the start of the window 708. The timing of the GO signal also preferably determines a maximum duration of the window 708. The end of the window 708 is caused either by the rising edge of IN or by the falling edge of the GO signal, the latter closing the window 708 if there is no IN signal during the time period of the window 708.

When it occurs, the rising edge of IN causes the falling edge of mutex R1 which removes the lock and gives the falling edge of the mutex G1 which causes the mutex G2 to rise since the mutex R2 was set by the GO signal.

Most devices today use synchronous circuits, however asynchronous circuits have the potential to be faster, have lower power consumption and provide better modularity. An asynchronous circuit is a sequential digital logic circuit which is not governed by a clock circuit or a global clock signal, instead using signals that indicate completion of instructions and operations specified by data transfer protocols.

To deal with high speed changes of state, it is desirable to avoid using a clock so that power consumption and electromagnetic interference can be reduced. It is also desired to create a memory element that is robust for metastable events. The present inventors have identified and realised a new need for a memory element which is not clocked, but also exhibits a behaviour where its output goes true from a leading edge of a set function until the leading edge of a reset function regardless of the state of the set and reset functions when each of their respective leading edges are detected.

The memory element of the disclosure may, in a preferred embodiment, be a bi-stable multi-vibrator which can receive two or more inputs and hold a logical state. The present disclosure is not exclusive to one of two multi-vibrators, but can also apply to logic elements with more than two states. However, for the purposes of illustration, we will refer to a memory element that receives a "set" input signal and a "reset" input signal which are used to set the value of a stored logical state between to be either true or false (these states being also referred to respectively as 1 and 0). In general herein, the labels of the logic states can be swapped, so where the disclosure refers to a "1" and a "0" it will be possible to swap the notations so long as the chosen convention is applied consistently.

In more detail, the inventors have identified a need for a latch which is asynchronous, and which follows the truth table below together with the notes and conditions as an inherent part of the requirements:

| First input (S) | Second input (R) | Output (Q) | Notes and Conditions |
|---|---|---|---|
| 0 | 0 | $Q_{N-1}$ (Previous data) | |
| 0 | 1 | 0 (RESET) | Reset - only if reset has gone to 0 after the last Q falling edge. This means there is no change if this state is entered from 11. |
| 1 | 0 | 1 (SET) | Set - only if set has gone to 0 after the last Q rising edge. This means there is no change if this state is entered from 11. |
| 1 | 1 | $\overline{Q}_{N-1}$ (inverting the previous data) | This occurs only at the point where the transition goes from 01 to 11 or 10 to 11 or 00 to 11. This means it will not continue to oscillate with 11 since it is asynchronous and will only respond to transitions. |

Figure 8:
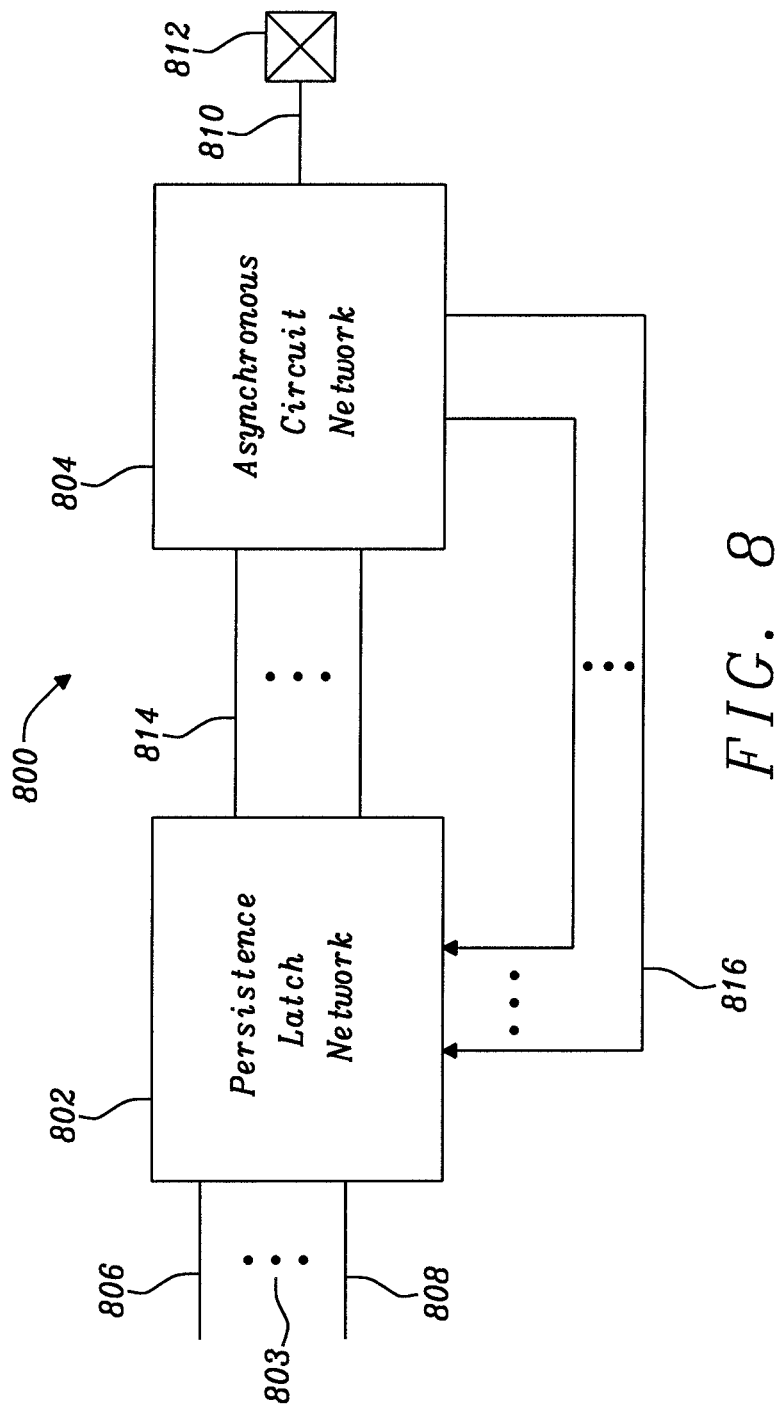
FIG. 8 shows an embodiment of the disclosure in its general form showing a memory element.

FIG. 8 illustrates memory element 800 according to an embodiment of the disclosure which implements these requirements. The circuit comprises a persistence latch network 802 and an asynchronous circuit network 804. The persistence latch network 802 is used to clean up the raw inputs removing any glitches and resolving any timing issues before the signals are routed to the asynchronous logic network 804.

The latch network 802 comprises a plurality of persistence latches whose outputs 814 reflect the status of the inputs 803 as discussed in more detail below. The plurality of persistence latches may include a first persistence latch for the rising edge of an input and a second persistence latch for the falling edge of that input.

The logic network 804 is asynchronous. It receives the "persistent" outputs 814 from the persistence latches and provides a plurality of trigger command signals, referred to also as GO signals, 816, as control inputs for the persistence latches. The plurality of trigger command signals 816 comprise at least one trigger command signal related to each persistence latch of the plurality of persistence latches. The asynchronous logic network 804 also provides an output 810 via an output node 812. The output 810 serves as the output of the memory element, whose value depends on the incoming signals 803 as discussed herein.

In a preferred embodiment, the memory element circuit 800 receives a set and a reset signal and the latch network 802 comprises an array of persistence latches which each include a separate persistence latch for the rising and falling edge of each input signal, and each receiving a GO input from the asynchronous circuit 804.

Figure 9:
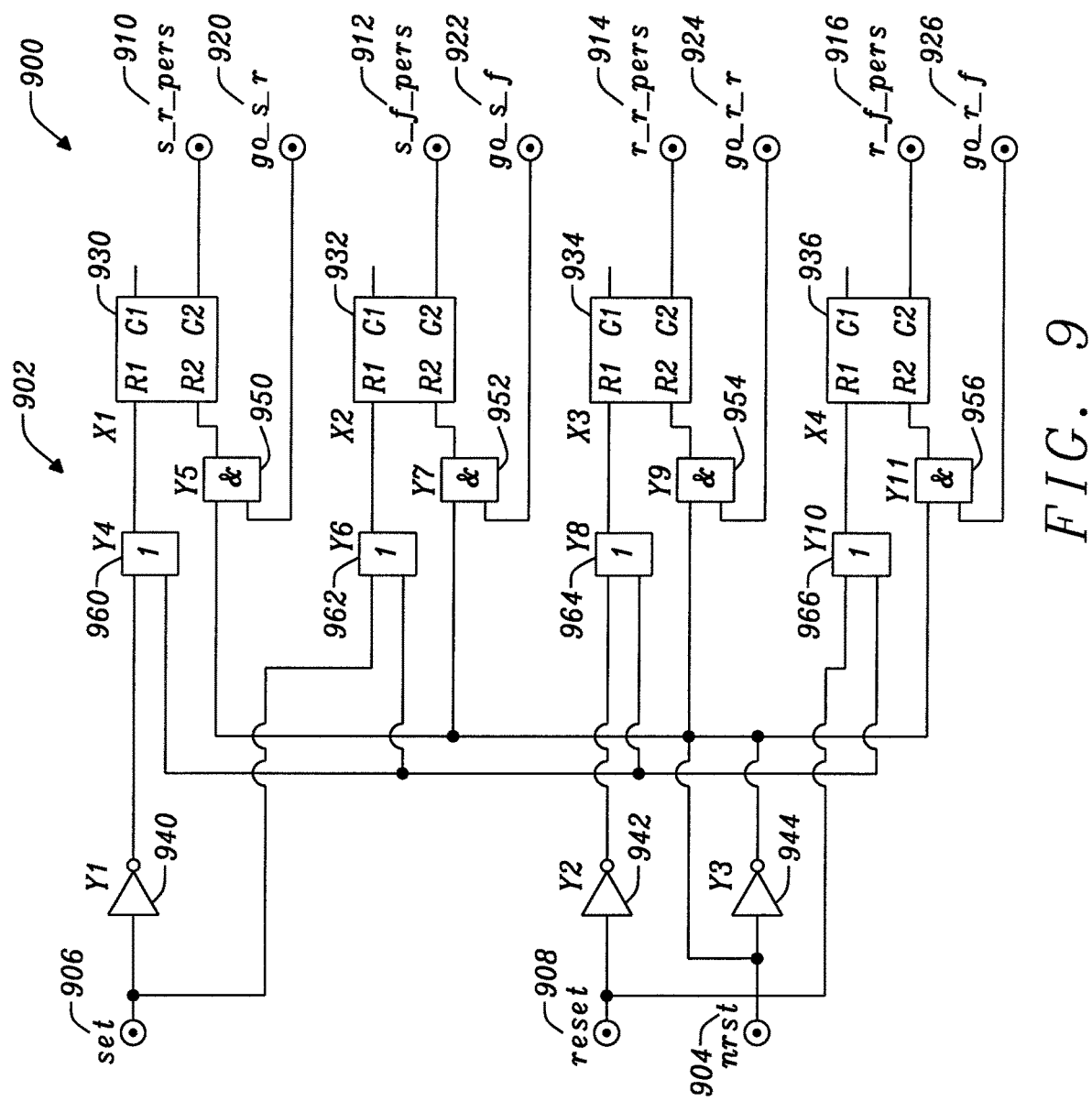
FIG. 9 shows one example embodiment of an array of persistence latches forming part of the embodiment shown in FIG. 8.

An embodiment of a latch network 802 is shown in FIG. 9. This circuit 900 comprises components which act as a plurality of persistence latches which are related to input signals. Here, there are two inputs, and a pair of persistence latches associated with each input, each pair of persistence latches providing persistent outputs when the respective rising and falling edges of the input signals are detected. The inputs comprise a set input 906 and a reset input 908. A first persistence output 910 s_r_pers goes true when a rising edge of the set input 906 is detected; a second persistence output 912 s_f_pers goes true when a falling edge of the set input 906 is detected; a third persistence output 914 r_r_pers goes true when a rising edge of the reset input 908 is detected; and fourth persistence output 916 r_f_pers goes true when a falling edge of the reset input 908 is detected.

The persistence latches are formed from components similar to those described above with respect to the example shown in FIG. 7; namely a set of inverters (Y1, Y2, Y3 940, 942, 944) a set of mutex elements (X1 930, X2 932, X3 934, X4 936) similar to the mutex 400 illustrated above, and a set of AND gates (Y5 950, Y7 952, Y9 954, Y11 956).

Note that within each pair of persistence latches, one will not have an inverter. One of the pair will receive an input from an inverter output and its complement will share its input with the input of the inverter—see for example, the input to the OR gate Y4, 960, provided by the output of the inverter Y1, 940 and the input to the OR gate Y6, 962, provided by the output to the inverter Y1, 940 and similarly the inputs to the OR gates Y8, 964 and Y10, 966 being provided by the respective output and input of the inverter Y2, 942.

The persistence latch network 900 also receives a set of trigger command signals, GO signals 920, 922, 924, 926, for each of the persistence latches.

Each persistence latch creates a persistent output to indicate that the condition of the corresponding input meets the condition of the relevant GO signal name when and only when it was seen at the input to the persistence latch. The persistent output will then remain in that state until the GO signal is removed, thus indicating the asynchronous logic has seen and acted on it.

The circuit 900 also receives a negative reset signal NRST, 904. This is used to indicate a starting condition of a persistence latch after a power on reset. When it is at a first logic state, for example, 1, meaning that there is no reset, the inputs to the four AND gates Y5 950, Y7 952, Y9 954 and Y11 956 are held high, thus allowing the asynchronous circuit to pass the corresponding GO signals 920, 922, 924, 926 in to the mutex cells 930, 932, 934, 936. The output of the inverter Y3 944 is the opposite to the NRST signal being low in this example and thus in the no reset state, there is no impact through the OR gates Y4, Y6, Y8, Y10 960, 962, 964, 966.

However, when the circuit is being reset, the negative reset signal NRST 904 is at the other of its two logic states, being 0 in this example, meaning that the output of the inverter Y3, 944 is 1 and so the R1 inputs of the mutex elements X1 930, X2 932, X3 934 and X4 936 are all held high thus indicating that the signal of interest is not true. For example, this gives the same R1 input to X1 930 as though set was false. This causes G1 to be true on all four mutex cells and G2 which is the persistence latch output in all four cases will be set to zero.

Therefore, the above circuit provides the ability to observe the sequence of the set and reset functions as controlled by the GO signals coming from the asynchronous logic circuit 804.

The system 800 also provides an asynchronous circuit 804 that controls the GO signals. The asynchronous circuit 804 specifies a sequence of state transitions which ensure that the output signal of the circuit always starts at the rising edge of a set signal and always falls at the rising edge of the reset signal, even if the set and reset signals overlap in all use cases.

It will be appreciated that this behaviour can be achieved many different state transitions and for each state transition sequence there are many different arrangements of logic elements that could be used to implement each desired sequence. For the clarity of description, some embodiments will be discussed below.

Figure 10:
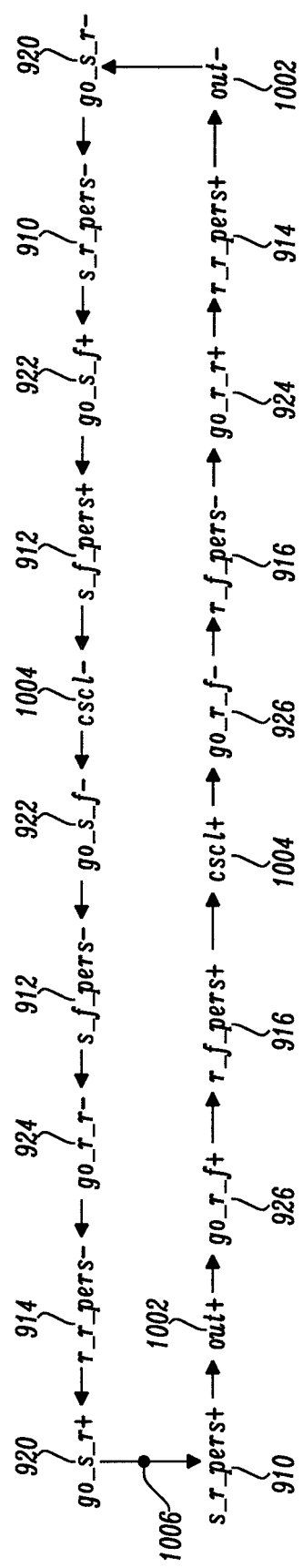
FIG. 10 illustrates a state transition diagram for an asynchronous circuit.

FIG. 10 shows a first example state transition diagram for the asynchronous circuit 804 shown in FIG. 8 and which can provide the GO signals 920, 922, 924 and 926 of FIG. 9. The diagram of FIG. 10 also illustrates the outputs 1002 and an internal state variable CSC, which is inserted to ensure compliance with a complete state coding property to disambiguate conflicting states. In the notation of the state transition diagram of FIG. 10, a plus sign at the end of a signal indicates that the signal is rising and a minus sign at the end of the signal indicates that the signal is falling. The state transition graph comprises a token 1006, which moves counter-clockwise around the state transition diagram when the events occur.

By observing the sequence of persistence outputs which go into the asynchronous circuit 804 and the GO signals which come from the asynchronous circuit 804, one can see that the state transitions are organised to ensure a specific sequence. In this example, the sequence is s_r_pers rise, r_f_pers rise then fall, r_r_pers rise then s_r_pers fall followed by s_f_pers rise then fall and finally r_r_pers fall.

The reason this sequence can be maintained, even though the original set and reset signals may indeed overlap is that a persistence latch output is terminated by its corresponding GO signal, which is dropped as soon as it is seen to have risen.

Figure 11:
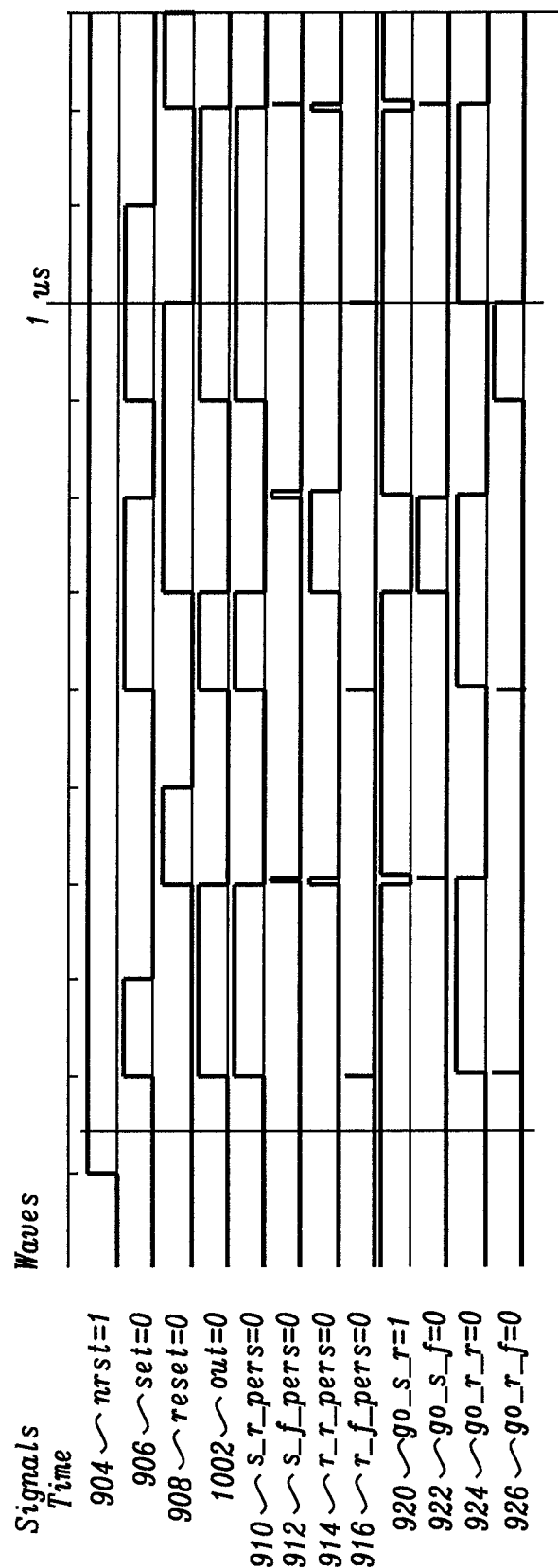
FIG. 11 illustrates a waveform indicating relationships of the signals defined in the state transition diagram of FIG. 10.

The sequence is also illustrated in the waveform of FIG. 11. It can be seen here that the output signal 1002 consistently starts at the rising edge of the set signal 906 and falls at the rising edge of the reset signal 908.

Figure 12:
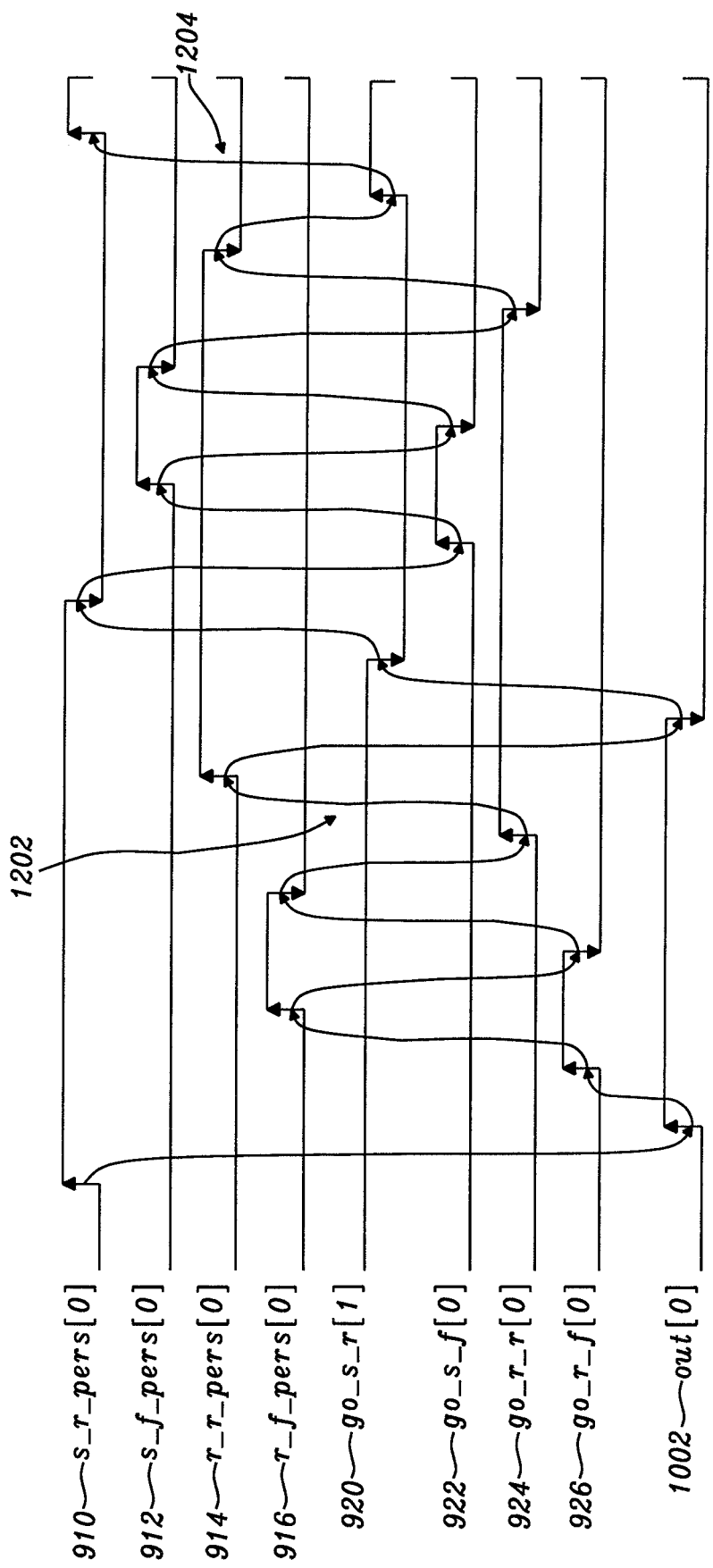
FIG. 12 illustrates a waveform sequence dictated by an asynchronous circuit relating to FIGS. 9 and 10.

The state diagram operation can also be seen with its dependencies through the timing diagram of FIG. 12, which shows the persistence signals only. The arrows in the timing diagram of FIG. 12 demonstrate the asynchronous state machine sequence and the order that successive events must occur in.

Once the output of the rising edge of the set signal of persistence latch is seen to go high, the output 1002 goes high. Then the system ensures that there is a low section of the reset before it determines a rising edge of the reset; this occurs at the point 1202 shown in FIG. 12. At that point, the output 1002 is dropped.

Similarly, the system ensures that there is a low section of the set function before it allows for the detection of its rising edge at which time it will again see the rising edge of the set function and then will raise the output again.

Figure 13:
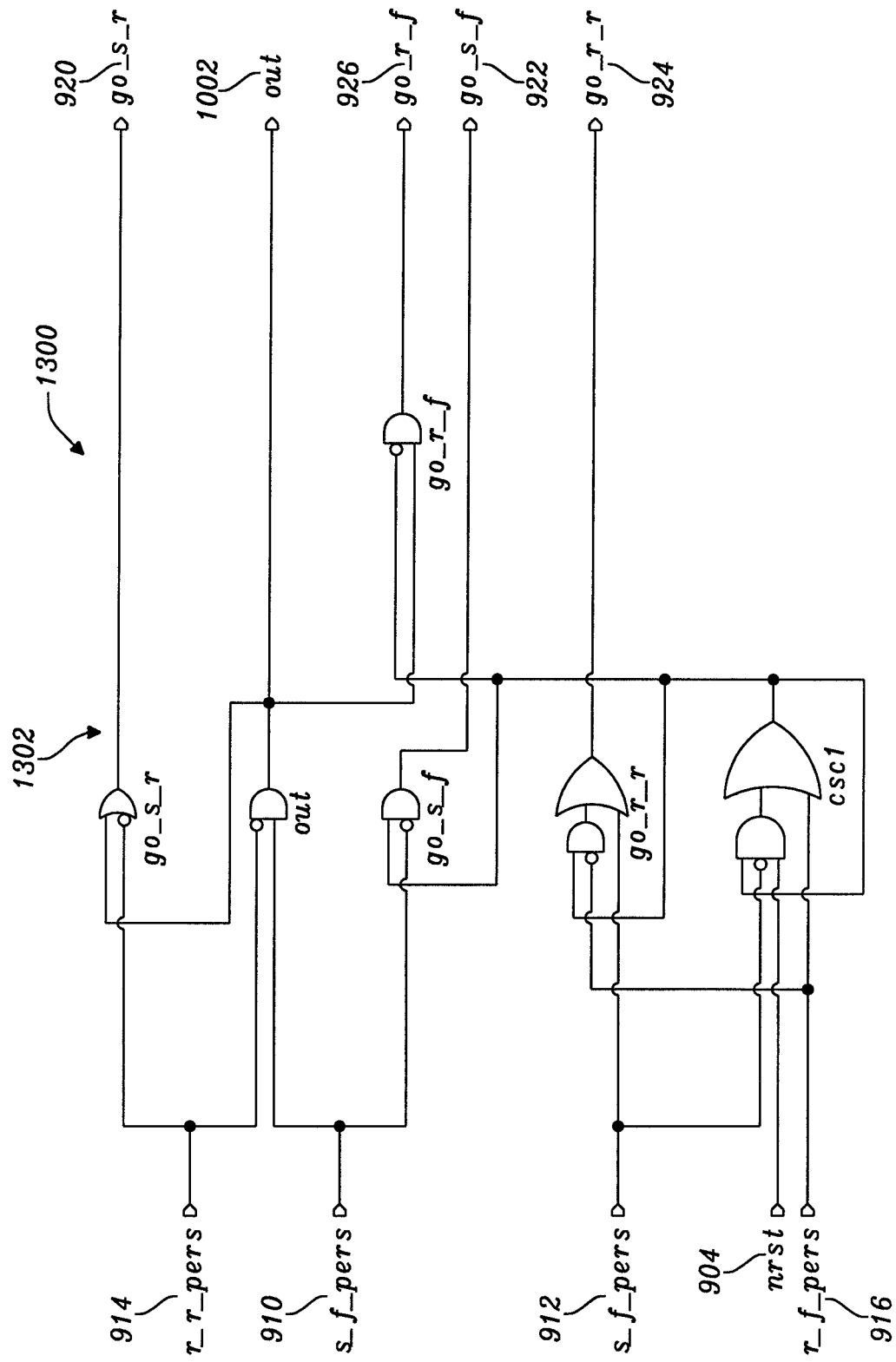
FIG. 13 illustrates an example of synthesised logic for the state transition graph of FIG. 10.

This state transition sequence may be synthesised by any suitable arrangement of logic elements. FIG. 13 shows one example embodiment of an asynchronous circuit 1300 which is suitable for implementing the state transition sequence illustrated with reference to FIGS. 10-12. If one carefully follows the logic in FIG. 13, one will see that it creates the same sequence of operations as does the state transition graph of FIG. 10. The asynchronous circuit 1300 comprises a collection of Boolean logic gates 1302 which are connected in such a way to provide the required functionality. The negative reset signal 904 is used to ensure that the token 1006 is in the correct state for the beginning of the operation after reset. It will be appreciated that other logic circuits can be constructed that perform the same functionality.

Figure 14:
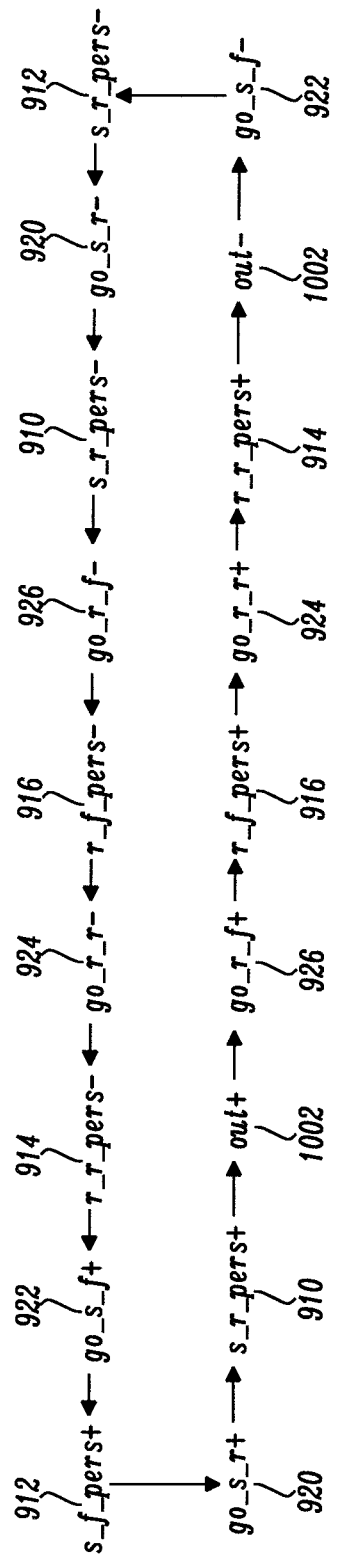
FIG. 14 illustrates a state transition sequence according to an alternative embodiment.
Figure 15:
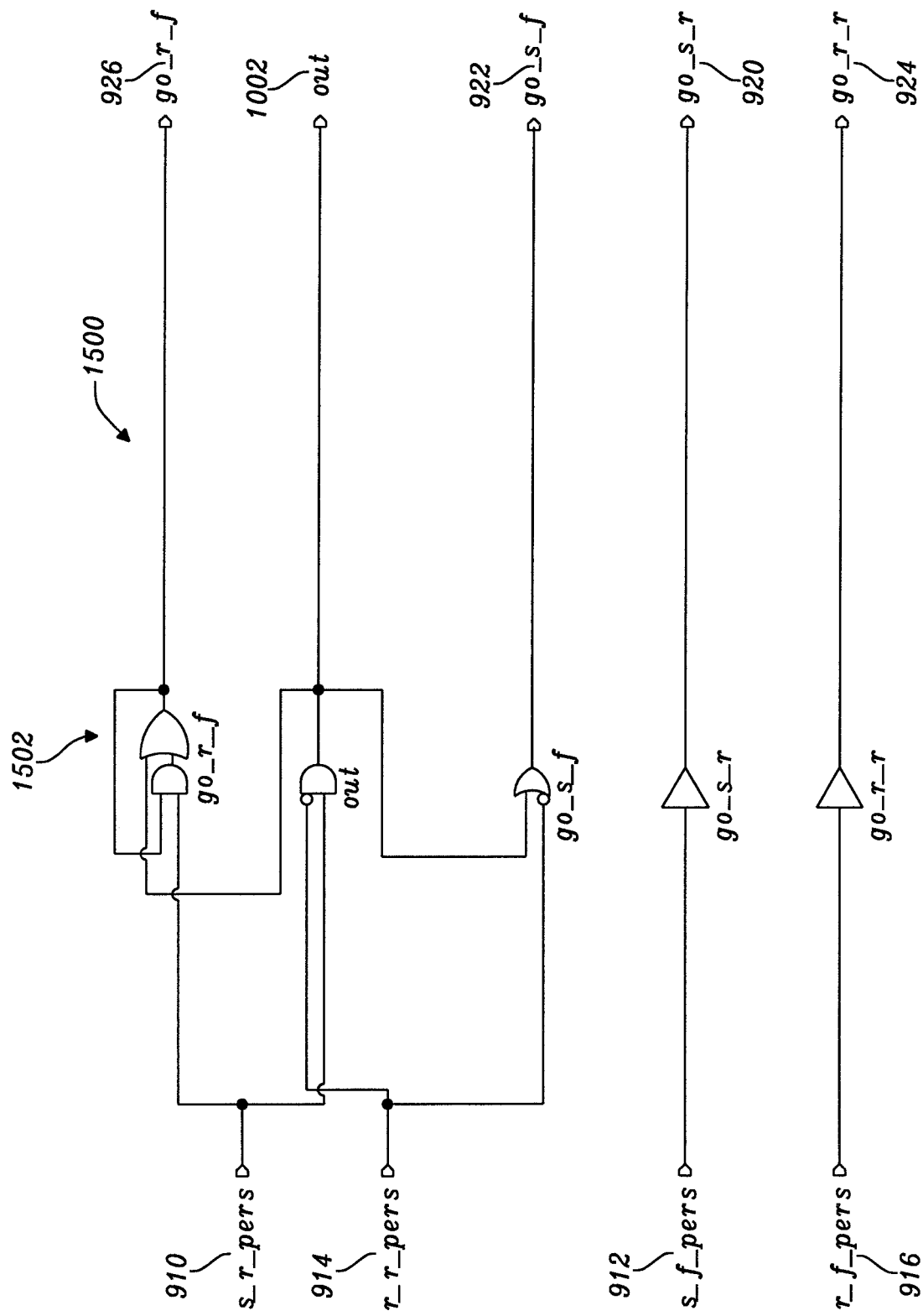
FIG. 15 shows a circuit which can implement the state transition sequence of FIG. 14.

As mentioned above, there can be different state transition sequences that provide the required functionality. An alternative embodiment of a suitable state sequence is shown in FIG. 14, with a suitable asynchronous circuit for its implementation illustrated in FIG. 15. It will be appreciated that the asynchronous circuit of FIG. 15 is just one example of suitable circuitry for implementing the state transition graph of FIG. 14, which is in itself only one suitable example of implementing the functionality of the disclosure.

The states of the state transition graph of FIG. 14 are similar to those previously illustrated. The state S_R_PERS+ detects the rising edge of the set signal and then the output goes high when the rising edge of the set signal is detected. The state 916 R_F_PERS+ detects that there is a low section of the reset before the reset goes high. The state 914 R_R_PERS+ detects the rising edge of the reset signal which is then followed by the output signal 1002 going low when the rising edge of the reset is detected. The state 922 GO_S_F− resets the mutex detectors in sequence and then the state 912 S_F_PERS+ detects that there is a low section of the set before the set is set high.

It can be seen that this state transition graph does not require an additional CSC component and there are minimum gate delays between the out signal 1002 rising and falling which minimises the pulse width to be set as compared with the embodiment of FIGS. 9-11. Furthermore, there is no requirement for any reset functions (nrst) in the synthesised circuit as shown in FIG. 15. Similar to the synthesised circuit of FIG. 13, the asynchronous circuit 1500 of FIG. 15 comprises a set of logic gates 1502 that provide the functionality of the state transition diagram of FIG. 14.

According to the disclosure, the persistence latches will set their outputs when their respective GO signal is set and the input becomes true or if the signal is already true when the GO signal gets set.

This means one does not have to wait for an edge to know that one is ready to wait for the opposite edge, but one only needs to see its level. This allows the sequence of observations to be defined in a clear and simple way and means that every edge is caught regardless of the overlapping condition of the raw set and reset signals.

The combination of an asynchronous circuit providing the required functionality together with an array of persistence latches as shown in the disclosure, implements a latch which is not clocked but also exhibits the behaviour where its output goes true from the leading edge of the set function to the leading edge of the reset function regardless of the state of the set and reset functions when each of their leading edges are detected.

The improved memory element of the disclosure can be used to provide an RS latch functionality that is robust for all cases where the set and reset functions may overlap and more generally provides an improved logic functionality where the input signals can overlap. This has particular applicability in use cases where a latch may be expected to change its status very rapidly, and so provides improvements over the art.

One example area where the disclosure may be applied is in the field of a switched mode power supply (SMPS) which has a half-bridge circuit that is driven by a memory element.

Figure 16:
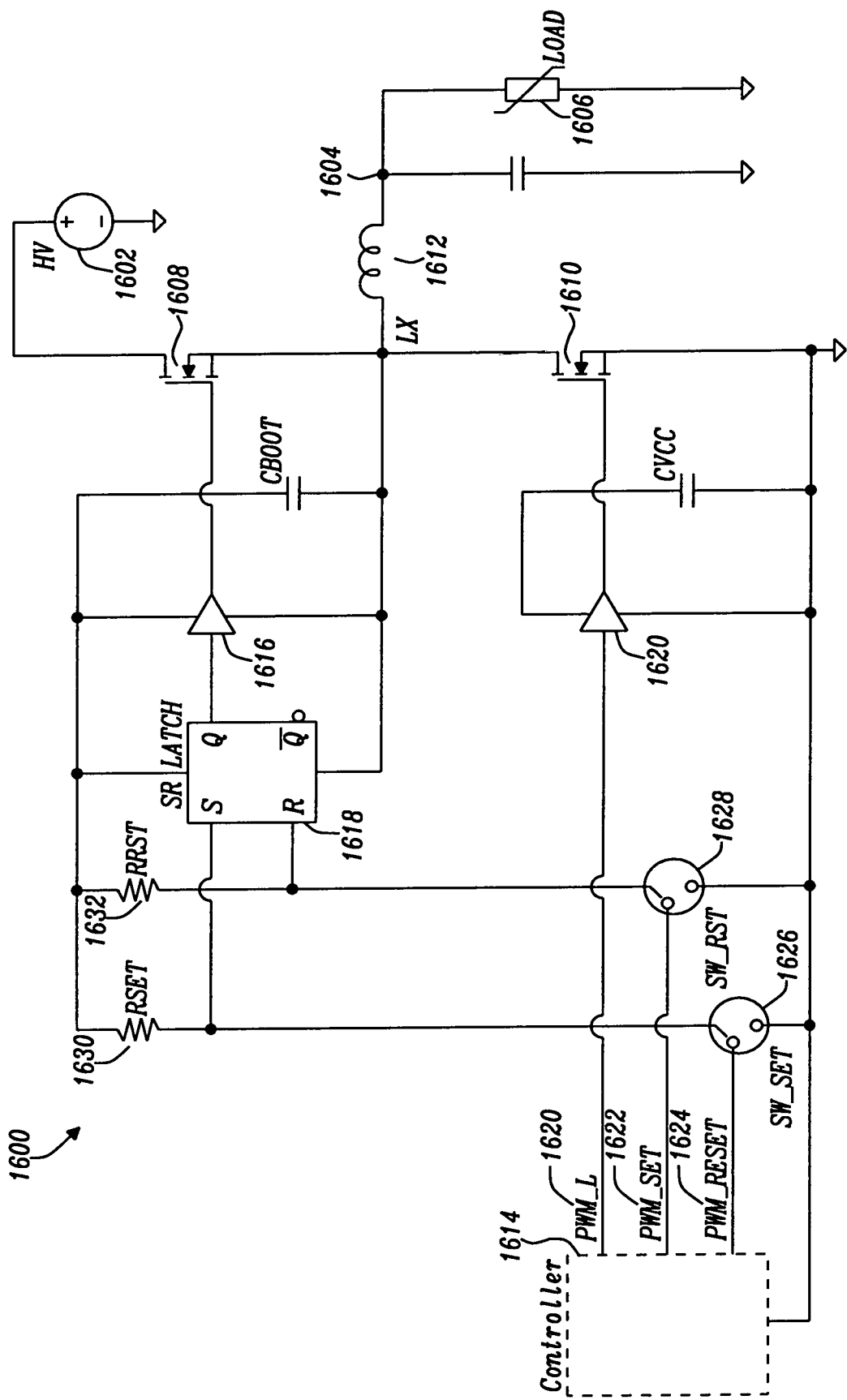
FIG. 16 illustrates a prior art switched mode power supply.

FIG. 16 shows an example of such a circuit. This is a buck converter 1600 which converts a high input voltage Vin 1602 to an output voltage Vout seen at node 1604 driving a load 1606. The half-bridge circuit comprises a high side switch 1608 and low side switch 1610 which are selectively operated to control the energy supplied to an energy storage element 1612, which in this case is an inductor. The operation of the high side and low side switches 1608, 1610 is governed by a controller 1614 that provides pulse width modulated control signals which are used to control the duty cycle of the high side and low side switches 1608, 1610 to regulate the output voltage supplied to the load 1606. A high side driver comprises an amplifier 1616 with its input provided by the output of an RS flip flop 1618 ("SR_LATCH"), whose set (S) and reset (R) inputs are provided by respective pulse width modulation control signals PWM_SET 1622 and PWM_RESET 1624 provided by the controller 1614. Level translation of PWM_SET 1622 and PWM_RESET 1624 is provided with a set switch device SW_SET 1626 and a reset switch device SW_RST 1628 together with respective resistors RSET 1630 and RRST 1632. The low side switch 1610 is driven by an amplifier which receives a separate pulse width modulation control signal PWM_L from the controller 1614. The detailed operation of such a converter 1600 is well known and will not be discussed in detail herein. The high side driver comprises the switches, resistor, memory element, and amplifier.

Recently, wide band gap semiconductor materials have been drawing attention for use in switching devices and transistors in power electronics applications, the prime example being gallium nitride (GaN). When the transistors 1608, 1610 of the half-bridge are fabricated from GaN, they must both be N-type field effect transistors which means that a high side driver must also translate the output drive from the controller to the higher level at which the high side driver operates.

The high side driver ground is usually at a relatively high voltage, however, the pulse width modulation (PWM) signal for this high side driver is at a low voltage. It is therefore needed to have a high voltage level shifter for this high side driver to operate correctly.

A GaN high side driver usually uses an isolated level shifter because of high dV/dT noise and high frequency operation, but using an isolated level shifter results in a high cost because it must include a transformer for the isolation. So it would be desirable to use a conventional level shifter without the need for a transformer for using GaN transistors.

A conventional level shifter uses current pulses for level shifting; the current pulses which have pulse width modulation information go through the high side driver. During this event, there are many external parasitics to create delay of this information and this delay causes abnormal function during normal operation and this abnormal function can cause catastrophic failure of the whole system.

The current pulses are decoded to set and reset signals and these signals go to a logic block. This is often done with a standard RS flip-flop. However, for the GaN type of SPMS, the switching frequency is considerably increased and it becomes possible for the high side driver on time to actually become smaller than the width of either the set or reset pulses themselves. Therefore, where the set or reset functions overlap, the output of the RS flip-flop is not guaranteed for all possible steps.

Figure 17:
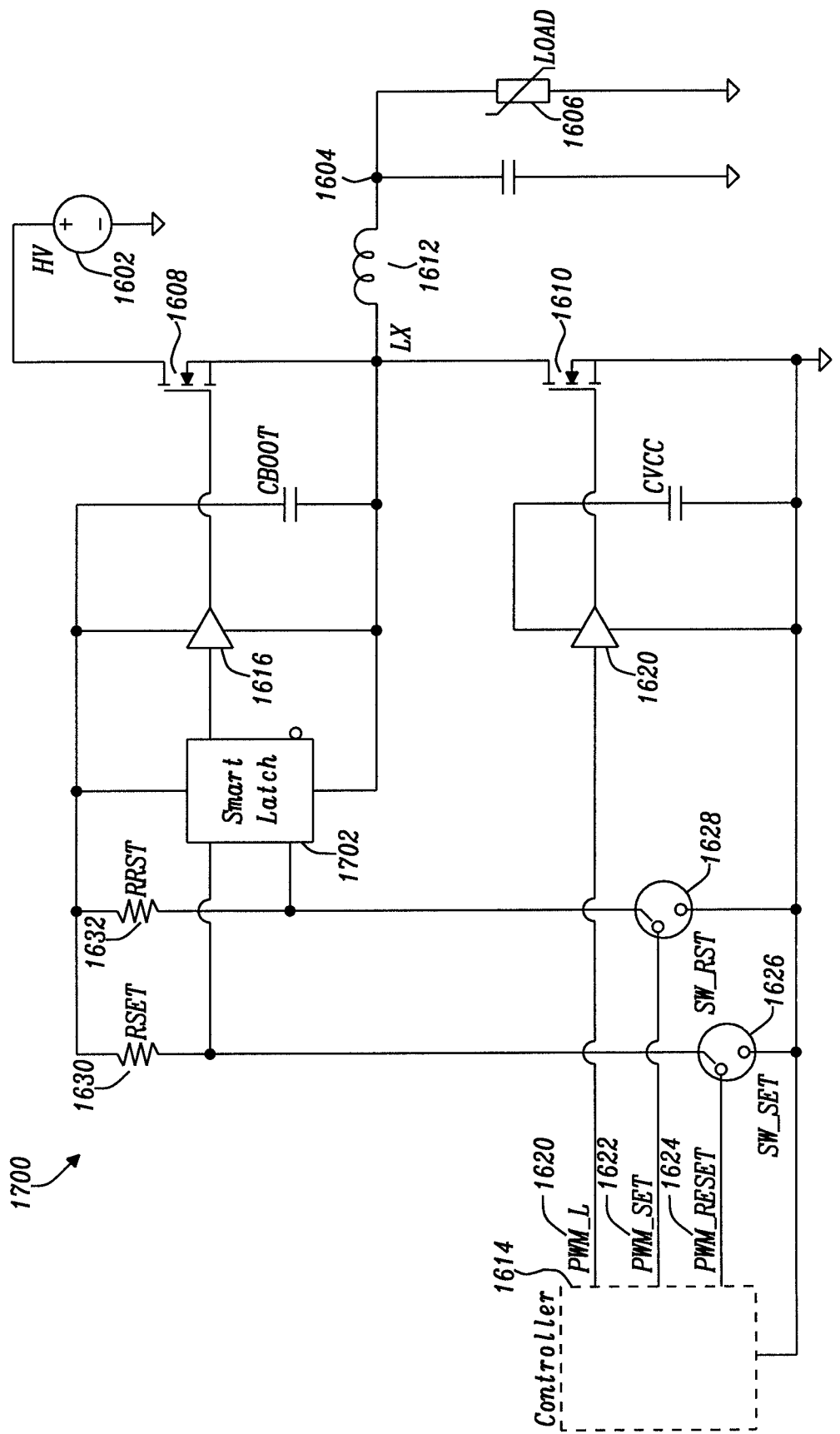
FIG. 17 illustrates a switched mode power supply according to an embodiment of the disclosure.

FIG. 17 shows a buck converter 1700 according to the present disclosure. This is similar to the converter 1600 of FIG. 16, except that the RS flip flop 1618 of FIG. 16 is replaced by a "smart latch" 1702 which comprises a memory element according to the present disclosure, such as that illustrated in FIG. 8. This has many advantages. Because there is no need to require that the set and reset signals do not overlap, a slower logic and a slower level shifter can be used to provide the drive for the GaN high side transistor. This allows for a silicon CMOS drive of the set and reset signals, where the set and reset functions do not need to be narrow enough so as to avoid overlap.

Various improvements and modifications may be made to the above without departing from the scope of the disclosure.

What is claimed is:

1. A memory element that is arranged to:
receive a plurality of inputs comprising a first input and a second input, wherein each of said first and second inputs comprises a digital signal that can transition between a first state via a first edge which triggers transition from the first state to the second state and a second edge which triggers transition from the second state to the first state;
retain a logical state based on said plurality of inputs; and
provide an output representing said retained logical state; wherein the memory element comprises:
a plurality of persistence latches providing a plurality of persistent outputs including one persistent output for each of the first and second edges of each input, wherein each persistence latch is arranged to receive an input trigger command from the asynchronous logic circuit which controls the opening and closing of a time window throughout the course of which an input signal is looked for by the persistence latch;
and an asynchronous circuit coupled with said plurality of persistence latches and configured to provide a plurality of trigger commands as control inputs for the persistence latches; and wherein
said asynchronous logic circuit provides a sequence of states whereby said logical state is retained at a first logical value throughout the course of a time period between the first edge of the first input and the first edge of the second input, irrespective of the state of both the first and second inputs when each of their respective first edges are detected.

2. The memory element of claim 1, wherein the plurality of persistence latches comprises a pair of persistence latches associated with each of the first and second input signals, a first member of said pair providing a persistence output which goes to a first logical value when a first edge of the associated input signal is received and a second member of said pair providing a persistence output which goes to a second logical value when a second edge of the associated input signal is received.

3. The memory element of claim 1, wherein one of said first and second inputs comprises a set signal and the other of said first and second inputs comprises a reset input.

4. The memory element of claim 3, wherein one of said first and second edges comprises a rising edge and the other of said first and second edges comprises a falling edge.

5. A high side driver for a power supply circuit comprising a memory element that retains a logical state and provides an output representing said logical state and which is used as a control signal for a high side switch element; wherein
said memory element is arranged to:
receive a plurality of inputs comprising a first input and a second input, wherein each of said first and second inputs comprises a digital signal that can transition between a first state via a first edge which triggers transition from the first state to the second state and a second edge which triggers transition from the second state to the first state;
retain a logical state based on said plurality of inputs; and
provide an output representing said retained logical state;
wherein the memory element comprises:
a plurality of persistence latches providing a plurality of persistent outputs including one persistent output for each of the first and second edges of each input, wherein each persistence latch is arranged to receive an input trigger command from the asynchronous logic circuit which controls the opening and closing of a time window throughout the course of which an input signal is looked for by the persistence latch;
and an asynchronous circuit coupled with said plurality of persistence latches and configured to provide a plurality of trigger commands as control inputs for the persistence latches; and wherein
said asynchronous logic circuit provides a sequence of states whereby said logical state is retained at a first logical value throughout the course of a time period between the first edge of the first input and the first edge of the second input, irrespective of the state of both the first and second inputs when each of their respective first edges are detected.

6. The high side driver of claim 5, wherein the plurality of persistence latches comprises a pair of persistence latches associated with each of the first and second input signals, a first member of said pair providing a persistence output which goes to a first logical value when a first edge of the associated input signal is received and a second member of said pair providing a persistence output which goes to a second logical value when a second edge of the associated input signal is received.

7. The high side driver of claim 5, wherein one of said first and second inputs comprises a set signal and the other of said first and second inputs comprises a reset input.

8. The high side driver of claim 7, wherein one of said first and second edges comprises a rising edge and the other of said first and second edges comprises a falling edge.

9. The high side driver of claim 5, wherein the high side switch is a Gan FET.

* * * * *